United States Patent [19]

Heitmann

[11] 4,143,326
[45] Mar. 6, 1979

[54] SIGNAL DELAY SYSTEM

[75] Inventor: Jürgen Heitmann, Seeheim, Fed. Rep. of Germany

[73] Assignee: Robert Bosch GmbH, Stuttgart, Fed. Rep. of Germany

[21] Appl. No.: 808,691

[22] Filed: Jun. 21, 1977

[30] Foreign Application Priority Data

Jun. 22, 1976 [DE] Fed. Rep. of Germany ....... 2627830

[51] Int. Cl.² ...................... H03K 5/159; H03K 21/36
[52] U.S. Cl. ......................................... 328/55; 328/37; 328/48; 235/92 SH
[58] Field of Search ............... 235/92 SH; 328/37, 48, 328/55

[56] References Cited

U.S. PATENT DOCUMENTS

| 3,044,065 | 7/1962 | Barney et al. | 328/48 X |
| 3,096,483 | 7/1963 | Ransom | 328/48 |
| 3,588,707 | 6/1971 | Manship | 328/55 |
| 3,675,049 | 7/1972 | Haven | 328/55 X |
| 3,851,154 | 11/1974 | Beecham | 235/92 SH |
| 3,941,982 | 3/1976 | Knollenberg et al. | 235/92 SH |

Primary Examiner—John S. Heyman
Attorney, Agent, or Firm—Littlepage, Quaintance, Murphy, Richardson and Webner

[57] ABSTRACT

An apparatus for delaying a signal n period lengths by the use of two shift registers which have capacities less than n but which have a total capacity greater than n. The signal to be delayed is fed to a first shift register until that shift register is full. The signal is then fed to a second shift register. Timing signals which control the shift registers' receipt of information are properly blanked in order to allow this result. When n bits of information have been recorded by the shift registers, the first shift register is again inputted causing an output which corresponds to the first data bits of the signal. While the first shift register is receiving and outputting the second cycle of information a pre-determined number of data bits are fed to the second shift register to fill the register. This cycle is repeated resulting in the storage of n data bits by a plurality of shift registers which each have a capacity less than n which have a total capacity greater than n.

4 Claims, 4 Drawing Figures

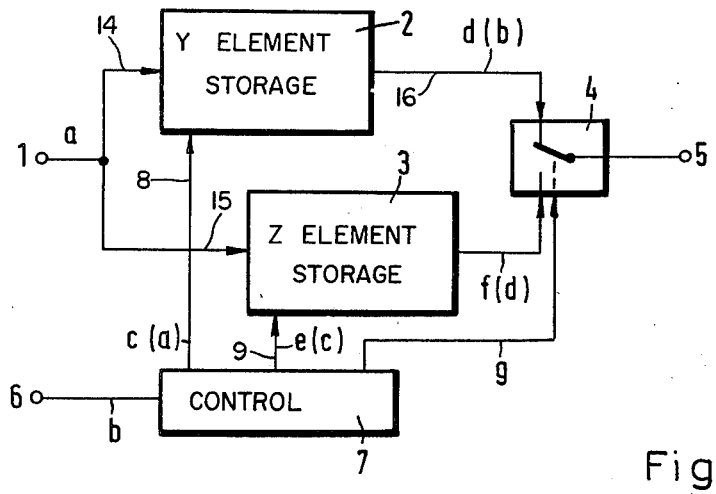
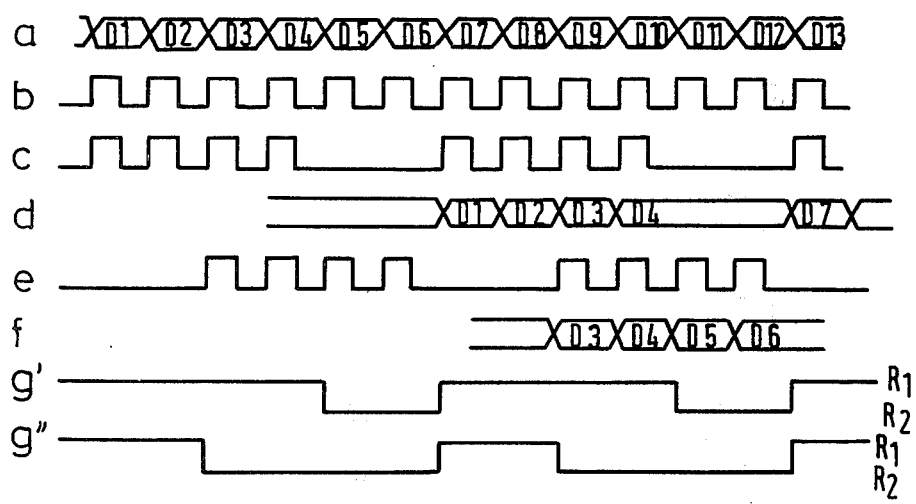
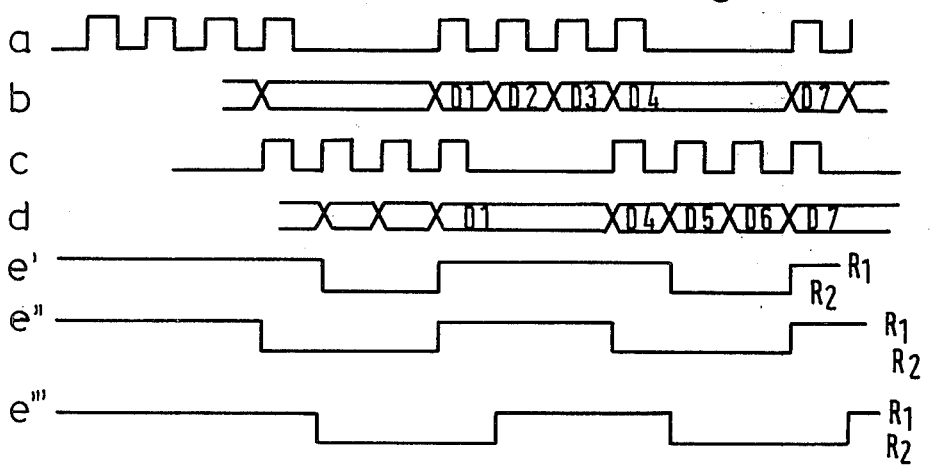

SIGNAL DELAY SYSTEM

BACKGROUND OF THE INVENTION

1. Field of the Invention

The invention generally relates to signal delay systems which are used to delay a signal for n period lengths and, more specifically, to signal delay systems which employ the use of shift registers requiring capacities which do not correspond to binary steps.

2. Description of the Prior Art

The use of shift registers to delay signals is well known. The delay time which can be achieved with a shift register is dependent on the frequency of the timing signal and the specific number of register elements of the shift register being used. Since the frequency of the timing signal is usually specified beforehand in general transmission systems, a set delay time can be realized only by a shift register with a corresponding number of register elements. However, moderately priced shift registers of integrated circuit designs are predominantly offered in shift register element numbers in binary steps ($2^n$).

SUMMARY OF THE INVENTION

The invention comprises two shift registers which are used to delay a signal n period lengths, the capacity of each shift register being less than n with the total capacity of both shift registers being greater than n. The signal to be delayed is fed simultaneously to first and second shift registers but the receipt of the signal and its data bits by the shift registers is selectively controlled by timing signals which are inputted to the shift registers. Generally, the data bits of the signal are fed first to the first shift register until that shift register is full and then to the second shift register until that shift register is full. This cycle is repeated. Additionally, during the storage of data bits into the first shift register, the required number of data bits necessary to fill the second shift register are stored in the second register. By selecting the output of each shift register at the proper time, the delayed signal can be received in proper sequence.

It is an object of this invention to provide a signal delay system that has the advantage of a shift register with a function of an arbitrary number of register elements using commercially available integrated circuits. It is a further object of this invention to provide a signal delay system particularly well suited to the delay of digitalized video signals. It is yet another object of this invention to provide shift registers with length of several thousands of bits such as those which fall in the binary gradation between $2^{10}$ and $2^{11}$.

BRIEF DESCRIPTION OF THE DRAWINGS

These objects and others will become apparent to those skilled in the art by referring to the accompanying drawings in which:

FIG. 1 is a block diagram of the signal delay system;

FIGS. 2 and 3 are time-sequenced diagrams of the various control circuitry shown in FIG. 1 wherein the upper portion of the step functions represent the "on" condition and the lower portions represent the "off" condition.

DESCRIPTION OF THE PREFERRED EMBODIMENT

Figure 4:
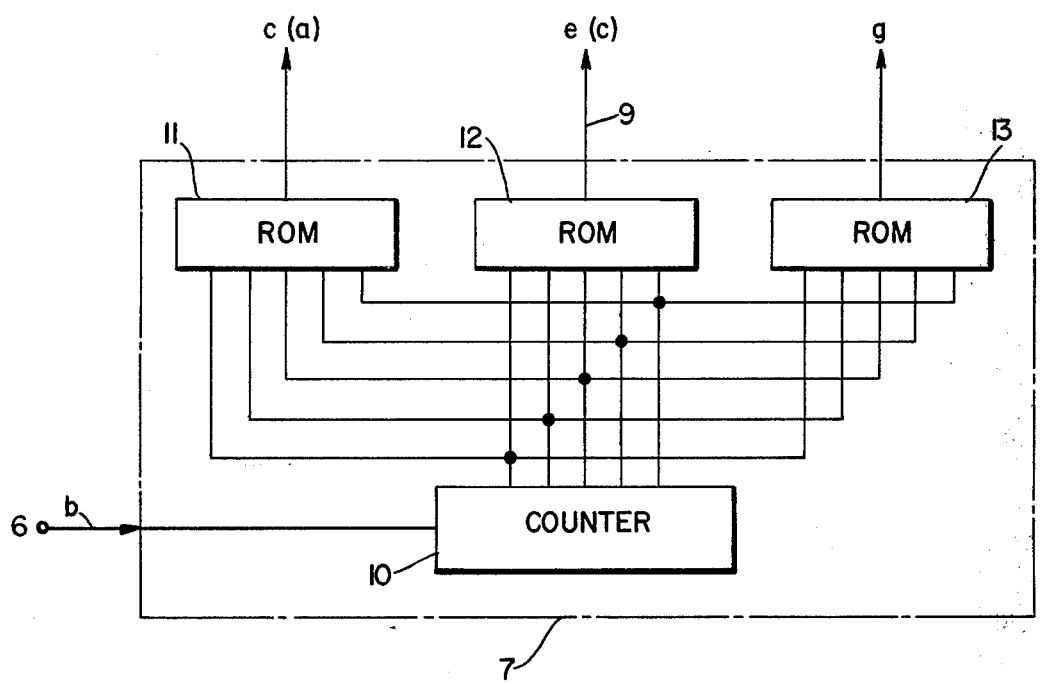
FIG. 4 is a block diagram of one embodiment of the control shown in FIG. 1.

In the block diagram of FIG. 1, a signal having frequency t which is to be delayed (shown by FIG. 2a) is fed via terminal 1 to a first shift register 2 and to a second shift register 3. The outputs of the two shift registers, 2 and 3, are connected to a control changeover switch 4 from the output of which a delayed signal is provided at terminal 5. The timing of the delayed signal is provided at terminal 5. The timing of the two shift registers 2 and 3 is accomplished by timing signals 8 and 9.

Assume that it is required to delay a signal n period lengths. Further, assume that two shift registers are readily available, the first shift register 2 has a capacity y and the second shift register 3 has a capacity z. Generally, y and z must each be less than n but must total greater than n. For simplicity, assume y is equal to or greater than z.

The storage of the signal is controlled by control 7 which inputs timing signal 8 to shift register 2 and timing signal 9 to shift register 3. The timing signals are structured to produce the following result. The data of the signal is first inputted into only shift register 2 until n−z data bits have been stored. At that time the signal is simultaneously inputted into shift register 2 and shift register 3. This condition continues until shift register 2 reaches capacity at which time the timing signal 8 is blanked and shift register 2 no longer receives any data. The signal continues to be stored by shift register 3 until it reaches capacity at which time this cycle is repeated. By selecting the proper time sequence of the outputs of shift registers, the properly delayed sequenced signal can be received. Specifically, during a given cycle the first n−z data bits are read by switch 4 from shift register 2 and the remaining z data bits are read from shift register 3. Alternatively, the first y data bits can be read by switch 4 from shift register 2 and the remaining n−y data bits can be read from shift register 3.

As can be seen, many variations are possible. This is because both shift registers mutually store x+y−n data bits and either shift register can be utilized by control 7 to provide these data bits through switch 4.

FIG. 4 is a block diagram for a possible form of a control switch 7. Additionally, the control switch 7 contains a counter 10 and a logical switching network consisting of constant storage units 11, 12 and 13. The impulse signal b is directed serially to the counter 10 at terminal 6. The counter 10 sorts or selects parallelly. At the exit of counter 10 only parallel present binary values are logically switched into the constant storage units 11, 12 and 13. Constant storage units of this type can, for example, be Read Only Memories (ROM).

EXAMPLE OF OPERATION

Assume for the explanation of the manner of operation that the signal having frequency t present at terminal 1 (FIG. 2a) is to be delayed by six period lengths of the timing signal (FIG. 2b) present at terminal 6 having frequency t. This delay would be realized in a simple manner with one shift register with six register elements. As mentioned at the outset, however, shift registers are usually offered only in register element numbers which come in binary steps. For the case of a delay of n = 6 periods of the specified timing signal (FIG. 2b), the number of register elements, y, of the first shift register 2, was taken as $2^2$, and the number of register elements, z, of the second shift register 3, was likewise chosen as $2^2$.

In one example of a time sequence of the control circuitry 7, based on FIG. 2, the signal a at input 1 (FIG. 2a) with four timing pulses c(a) at timing input 8 (FIG. 2c) is first placed in the first shift register 2 at input 14. The upper line (FIG. 2a) of FIG. 2 represents the signal of a data sequence at terminal 1. The numeration of this data sequence serves for a better understanding of the specific timewise position of a signal placed in registers 2 and 3. As can be seen from FIG. 2, the timing signal (FIG. 2c) for the first shift register 2, is blanked after a sequence of four timing pulses, i.e., the first shift register is cut off when it reaches capacity. Following the second timing pulse for the first shift register 2, the second shift register 3 is also triggered. Likewise, with four timing pulses e(c) at timing input 9, the signal a appearing at input 1 is placed in shift register 3 by input 15. After a sequence of four timing periods, the second register 3 is also cut off. At this moment, registers 2 and 3 are fully loaded.

After a sequence of six timing pulses of the timing signal (FIG. 2b) appearing at terminal 6, the blanking of the gated timing signal (FIG. 2c) for the first shift register is lifted, in accordance with FIG. 2c, and the signal read into the first shift register 2 is read out at output 16 providing d(b) and terminal 5 via the contact path of the controlled changeover switch 4, in accordance with a FIG. 2g'. Following the fourth timing pulse, the timing signal (FIG. 2c) for the first shift register 2 is again blanked. Simultaneously, the contact path of the controlled changeover switch 4 is connected to the output of the second shift register 3 by means of control 7 with the control signal in accordance with FIG. 2g' for the duration of two timing pulses providing f(d). Thereafter, a new control sequence begins through control circuit 7.

In another embodiment for controlling switch 4 shown in FIG. 2g", the contact path for the controlled changeover switch 4 is connected to the output of the first shift register 2 for the duration of the first two timing pulses. Following the second timing pulse, the contact path of the controlled changeover switch 4 is switched over for the duration of four timing pulses. This variation of the control sequence also repeats itself following six timing periods of the timing signal at terminal 6. The control signals pictured in FIGS. 2g' and 2g" should place the contact path of the controlled changeover switch 4 at the output of the first shift register 2 for the case of a high level $R_1$ and for a lower level $R_2$, should connect it to the output of the second shift register 3. The signals pictured in FIGS. 2d and 2f are the output signals of shift registers 2 and 3 respectively.

The diagrams shown in FIGS. 3e', e", and e'" picture three additional embodiments for a control sequence, in which case the blanking of the timing signals (FIGS. 3a and 3c) was changed for shift registers 2 and 3, in contrast to that for FIG. 2. In this case, there should appear at the timing input of the first shift register 2 a gated timing signal, in accordance with FIG. 3a, and at the timing input of the second shift register 3, there should be a timing signal, in accordance with FIG. 3c. The timewise sequence for the control of the contact path of the controlled changeover switch 4 can be determined by one of the control signals in FIG. 3e', 3e" or 3e'". Depending on the two timing signals (FIGS. 3a and 3c) and one of the control signals (FIG. 3e), the signal appearing at terminal 1 is read into both registers 2 and 3.

The readout of the two shift registers 2 and 3 is accomplished in accordance with the timewise sequence represented in FIGS. 3b and 3d.

A timing interruption (Blanking) is accomplished most expediently in control circuit 7 by counting the timing pulses appearing at terminal 6. Using a logic element, for example, by means of a fixed value memory, the two gated timing signals (FIGS. 2c and 2e, or FIGS. 3a and 3c) can be taken off for shift registers 2 and 3, and the control signal (FIG. 2g or FIG. 3e) can be taken off for controlled changeover switch 4.

The system of the invention is not only applicable to digital shift registers, but also to analog shift registers, for example, bucket brigade circuits and charge coupled storage chains.

What is claimed is:

1. An apparatus for delaying a digital signal for n periods of a timing signal having frequency t comprising:
   (a) first storage means having a capacity y which is less than n, having an input connected to the digital signal, having a control input, and having an output;
   (b) second storage means having a capacity z which is less than n and greater than n−y, having an input connected to the digital signal, having a control input and having an output;
   (c) switching means having a first input connected to the output of the first storage means, having a second input connected to the output of the second storage means, having a control input and having an output, said switching means selectively relaying signals received at its first and second inputs to its outputs; and
   (d) control means having an input for receiving the timing signal having frequency t, having a first output connected to the control input of the first storage means, having a second output connected to the control input of the second storage means, having a third output connected to the control input of the switching means, said control means controlling the receipt of the digital signal by the first storage means until its capacity is reached, controlling the receipt of a next portion of the digital signal to the second storage means until its capacity is reached, and, after n periods of the timing signal, controlling the switching means to selectively relay preselected portions of the stored signal in each storage means to the output thereof.

2. The apparatus described in claim 1 wherein said first storage means is a shift register and said second storage means is a shift register.

3. The apparatus described in claim 1 wherein said switching means is a control changeover switch.

4. An apparatus for delaying a digital signal for n periods of a timing signal having frequency t comprising:
   (a) first storage means having a capacity y which is less than n, having an input connected to the digital signal, having a control input, and having an output;
   (b) second storage means having a capacity z which is less than n and greater than n−y, having an input connected to the digital signal, having a control input and having an output;
   (c) switching means having a first input connected to the output of the first storage means, having a second input connected to the output of the second storage means, having a control input and having an output, said switching means selectively relaying signals received at its first and second inputs to its outputs; and (d) control means for controlling the receipt of the digital signal by the first and second storage means and the switching means, the control means comprising:
 (i) a counter having an input for receiving the timing signal and having an output,
 (ii) a first memory having an input connected to the output of the counter and having an output connected to said control input of the first storage means,
 (iii) a second memory having an input connected to the output of the counter and having an output connected to said control input of the second storage means, and
 (iv) a third memory having an input connected to the output of the counter and having an output connected to said control input of the switching means.

* * * * *